United States Patent
McGrath

(10) Patent No.: US 12,046,624 B2
(45) Date of Patent: Jul. 23, 2024

(54) TIME DELAY INTEGRATION STRUCTURE FOR COMPLEMENTARY METAL-OXIDE SEMICONDUCTOR IMAGING SENSOR

(71) Applicant: BAE Systems Imaging Solutions Inc., San Jose, CA (US)

(72) Inventor: Robert Daniel McGrath, Lexington, MA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 661 days.

(21) Appl. No.: 17/273,191

(22) PCT Filed: Nov. 21, 2018

(86) PCT No.: PCT/US2018/062277
§ 371 (c)(1),
(2) Date: Mar. 3, 2021

(87) PCT Pub. No.: WO2020/106292
PCT Pub. Date: May 28, 2020

(65) Prior Publication Data
US 2021/0327952 A1    Oct. 21, 2021

(51) Int. Cl.
*H01L 27/148* (2006.01)
*H01L 27/146* (2006.01)

(52) U.S. Cl.
CPC .. *H01L 27/14856* (2013.01); *H01L 27/14621* (2013.01); *H01L 27/14627* (2013.01); *H01L 27/1463* (2013.01); *H01L 27/14643* (2013.01); *H01L 27/14685* (2013.01)

(58) Field of Classification Search
CPC .................................. H01L 27/14856
See application file for complete search history.

(56) References Cited

U.S. PATENT DOCUMENTS

| | | | |
|---|---|---|---|
| 6,133,596 A * | 10/2000 | Woolaway | H01L 29/768 257/241 |
| 2005/0098842 A1 | 5/2005 | Yamamoto | |
| 2007/0153107 A1 | 7/2007 | Boettiger et al. | |
| 2008/0217661 A1 | 9/2008 | Lauxtermann | |
| 2014/0146209 A1 | 5/2014 | Wan et al. | |

OTHER PUBLICATIONS

International Search Report, PCT/US2018/062277, mailed Mar. 11, 2019, 9 pages.

* cited by examiner

*Primary Examiner* — Yu-Hsi D Sun
(74) *Attorney, Agent, or Firm* — Scott J. Asmus; Maine Cernota & Curran

(57) ABSTRACT

A system is provided for time delay integration in complementary metal oxide semiconductor imaging sensors, the system comprising: a two dimensional parallel charge transfer structure comprising at least one column of CMOS Image sensor pinned photodiodes; each the diode in the column being connected to the next the diode by a two phase transfer gate, each the transfer gate having a barrier and a well configured such that a flow of charge in the column is unidirectional.

12 Claims, 4 Drawing Sheets

TIME DELAY INTEGRATION STRUCTURE FOR COMPLEMENTARY METAL-OXIDE SEMICONDUCTOR IMAGING SENSOR

FIELD

The disclosure relates to systems and methods for time delay integration, and more particularly, to a systems and method for time delay integration in a complementary metal oxide semiconductor image sensor.

BACKGROUND

Time-Delay-Integration (TDI) is an effective way to enhance the image collected by Charge-Coupled Devices (CCD) especially in the special case of objects moving at a known rate. It synchronizes the motion in the image focal plane with the motion of the objects, allows the photocharge to be integrated over multiple stages of the focal plane in a noise-free manner. However CCD image sensors typically require a special fabrication process, operate at voltages outside normal circuit operating range and are not easily integrated with other circuitry to drive, process and read out the signal. CMOS image sensors have been replacing CCD's in imaging applications, but normal CMOS image sensors cannot do charge transfer summing required to get the low noise advantage of TDI, instead relying on the approach illustrated in FIG. 1, where a charge transfer and readout is provided at each pixel of the CMOS sensor. In this arrangement of FIG. 1, inter-pixel isolation is provided by shallow trench structure 1, disposed within a first doping region 2, within a second doping region 3, thus creating a photodiode 4. A transfer gate 5 is disposed between the diode 4 and the floating diffusion 6. The transfer gate 5 is coupled to a reset transistor 7 and an active transistor 8 which is configured to produce a readout signal 9 when photons are incident on the photodiode.

What is needed, therefore, are techniques for adapting CMOS image sensors to better accommodate Time-Delay-Integration.

BRIEF SUMMARY

One embodiment provides a system for time delay integration in Complementary Metal Oxide Semiconductor (CMOS) imaging sensors, the system comprising: a two dimensional parallel charge transfer structure comprising at least one column of CMOS image sensor pinned photodiodes; each the diode in the column being connected to the next diode by a two phase transfer gate, each the transfer gate having a barrier and a well configured such that a flow of charge in the column is unidirectional.

Another embodiment provides such a system wherein each the well is configured to hold the full well capacity of a pixel.

A further embodiment provides such a system further comprising a microlens disposed so as to direct photons between the transfer gates into the photodiodes.

Even another embodiment provides such a system further comprising at least one color filter.

An even further embodiment provides such a system wherein the system comprises a plurality of the columns of CMOS image sensor pinned photodiodes in an array.

Still another embodiment provides such a system wherein the system comprises a plurality of arrays.

One embodiment provides a method for manufacturing a time delay integrated CMOS imaging sensor, the method comprising: starting with a wafer substrate; isolating at least one pixel; doping at least a first region of the substrate to for at least one transfer well; doping at least a second region of the substrate to form at least one transfer barrier; Forming a transfer gate from the at least one transfer barrier; doping at least a third region of the substrate to form a photodiode barrier; doping at least a fourth region of the substrate to form a photodiode well; forming gate sidewalls in the substrate; Applying a photodiode pinning layer to the substrate; forming at least one connection on the substrate, the connection being selected from the group of connections consisting of contacts, metal vias, and interconnects; and formation of at least one chip from the substrate.

Another embodiment provides such a method wherein the isolating the at least one pixel comprises forming shallow trenches between columns of the pixels.

A further embodiment provides such a method wherein the step of forming shallow trenches between the columns of the pixels is etching the shallow trenches between the columns of the pixels.

Yet another embodiment provides such a method wherein the isolating at least one pixel comprises doping the wafer substrate in a pattern so as to isolate the pixel.

A yet further embodiment provides such a method further comprising: doping at least fifth region of the substrate as a Field Effect Transistor threshold shift region; forming a field effect transistor from the Field Effect Transistor threshold shift region; and doping the fifth region of the substrate to form at least one Field effect transistor source and at least one Field Effect Transistor drain.

Still another embodiment provides such a method further comprising forming a sensor from the chip.

A still further embodiment provides such a method further comprising disposing at least one microlens proximate to the at least one pixel, such that light passing through the microlens is directed toward a photodiode comprising the photodiode barrier and photodiode well.

Even another embodiment provides such a method further comprising disposing a color filter proximate to the pixel such that light incident on the pixel is filtered.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
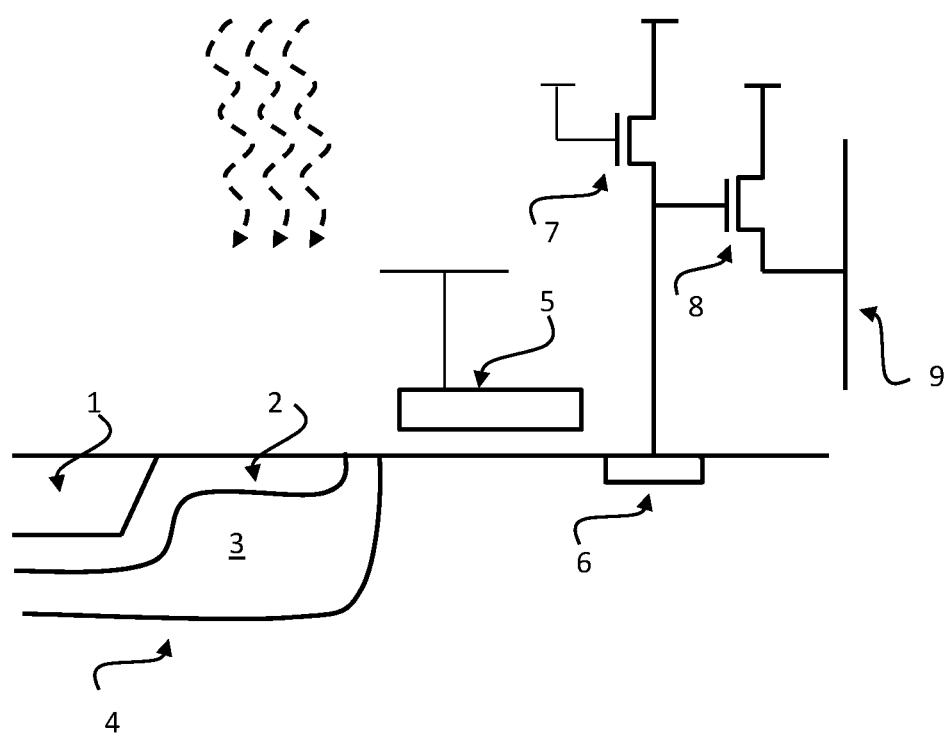
FIG. 1 is a block diagram illustrating a sensor in accordance with a known CMOS image sensor.
Figure 2A:
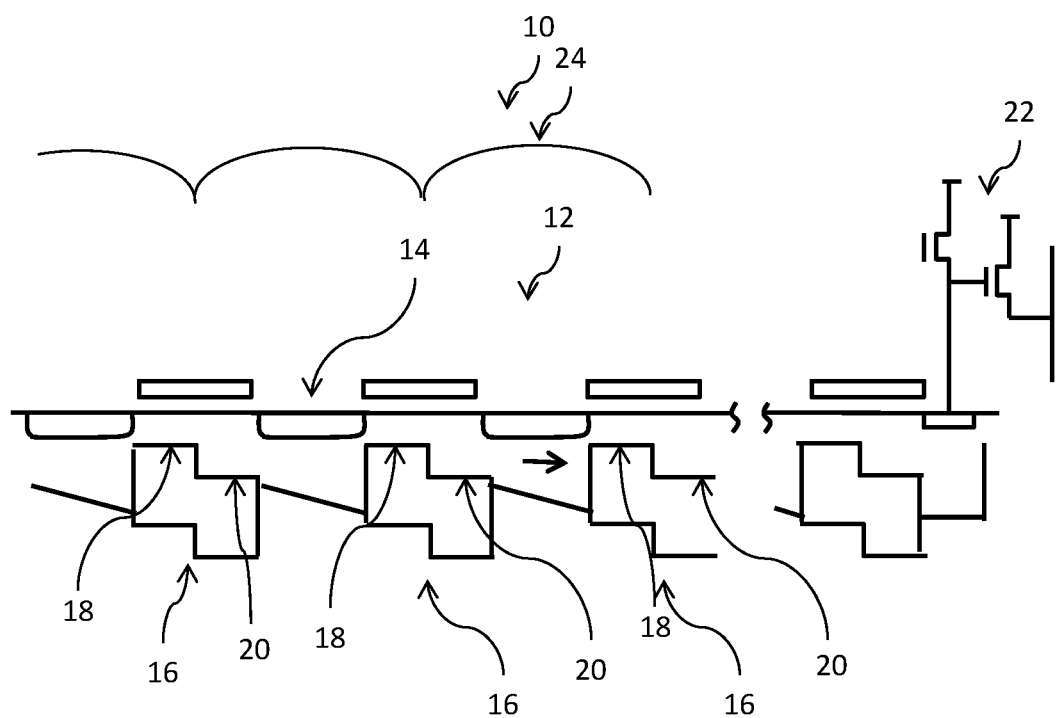
FIG. 2A is a block diagram illustrating a system configured in accordance with one embodiment in which a potential gradient is used to provide unidirectional transfer.
Figure 2B:
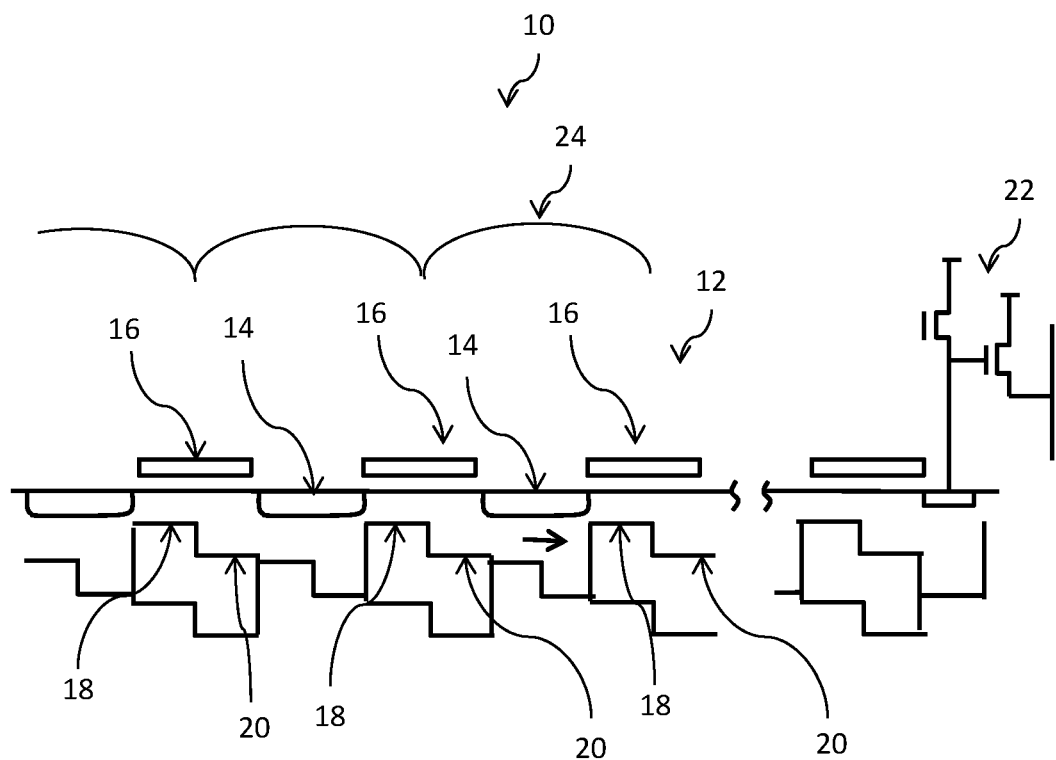
FIG. 2B is a block diagram illustrating a system configured in accordance with one embodiment in which a step potential is used to provide unidirectional transfer.

As illustrated in FIGS. 2A and 2B, according to embodiments, a hybrid device 10 is provided where the focal plane is a 2 dimensional parallel charge (comprising rows and columns) transfer structure built using columns 12 of CMOS image sensor pinned photodiodes 14 connected by two phase transfer gates 16 disposed with each pixel so that the during clocking the potentials on the gates the photodiode charge is constrained by the two phases within the transfer gate 16 to movement only in one direction. Effectively, when the transfer gate 16 is off, the charge is held in the photodiode 14, but when the transfer gate is on, the charge is held in the transfer gate 16 itself. Effectively, there is a continuous stream of readings for light in the projected image such that the readings progress along the TDI channel in synchrony with the movement of the image. The system provides for complete emptying of each photodiode 14 into the next in the chain of pixels due to the transfer of any charge to the next stage. In the embodiment of FIG. 2A, the transfer is via a potential gradient, while in that of FIG. 2B, a step potential is used for the same purpose. Subsequently the charge would be moved in parallel along the chain of photodiode columns 12 and would be read out by a floating diffusion 22 at the end of each column 12. The floating diffusion 22 is reset and then is read out sequentially each packet of charge coming along the TDI channel. Each transfer gate 16 would have a barrier 18 and a well section 20 to provide the unidirectional charge transfer of charge within the transfer gate 16 and consequently the column 12. The well portion 20 would be configured to be able to hold the full capacity of a pixel. High optical collection efficiency would be achieved by having a microlens 24 direct the photons between the transfer gates into the exposed pinned photodiodes.

One skilled in the art will recognize that the TDI is implemented as described above. However a sensor, configured according to embodiments provides that the charge be able to be shifted in a loss-less, noiseless synchrony with the movement of an optical image being projected on it.

Figure 3:
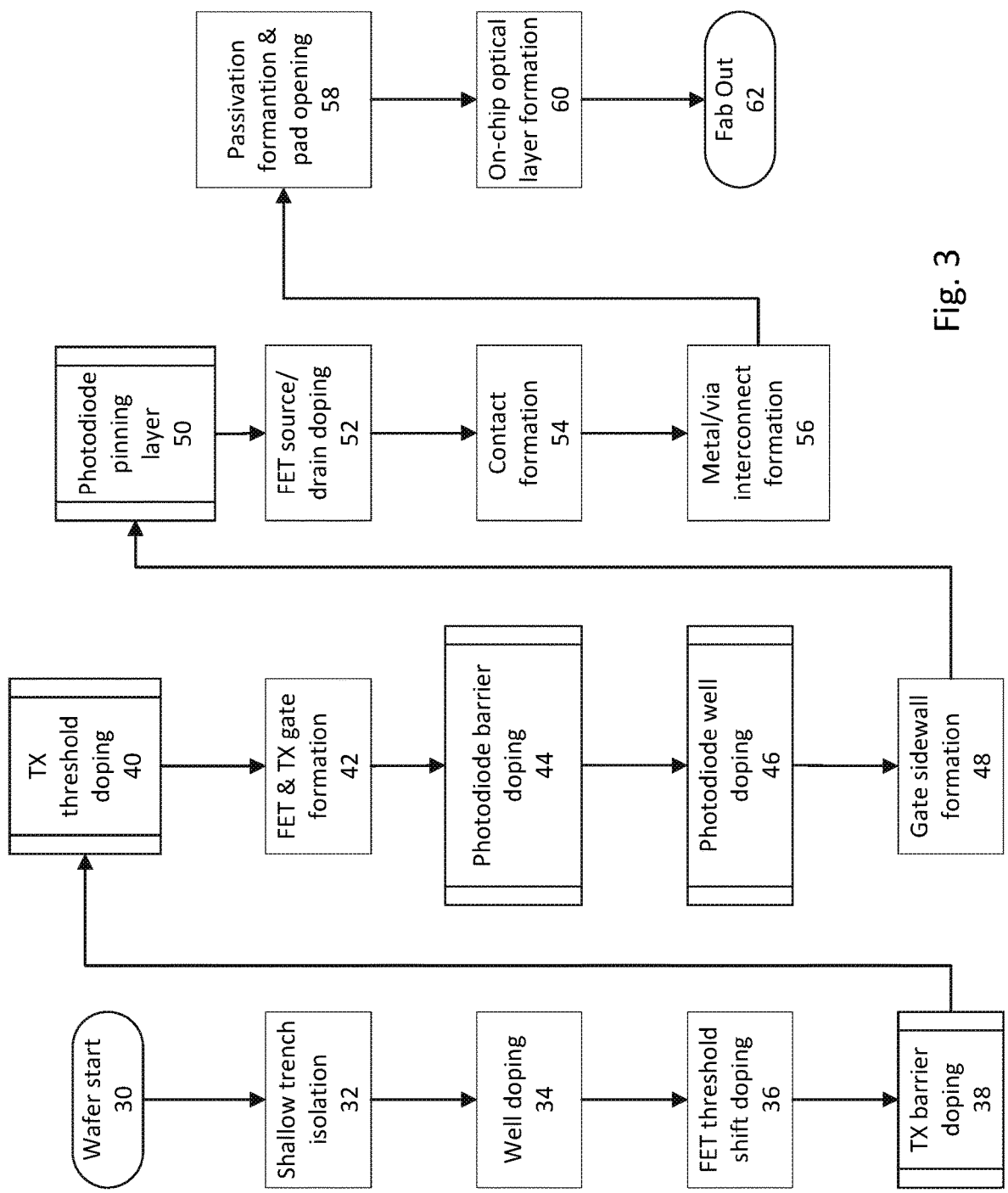
FIG. 3 is a flow chart illustrating a method configured in accordance with one embodiment.

As illustrated in the flowchart of FIG. 3, such a system is manufactured by starting with a wafer substrate 30 and isolating pixels with shallow trenches 32. Regions of pixels desired to be wells are then doped 34 as are the Field Effect Transistor (FET) threshold shift region 36, the Transfer (TX) barrier 38, and the TX threshold 40. The FET and TX gates are then formed 42. Photodiode barrier 44 and well are doped 46. Subsequently, gate sidewalls are formed 48 and a photodiode pinning layer is applied 50. FET source and drain are doped 52. Contacts are then formed 54 as are metal vias and interconnects 56. Passivation formation and pad opening is performed 58 and on chip optical formation 60 is carried out before the sensor fabrication process is complete 62.

As discussed above with regard to FIG. 2A and 2B, embodiments provide a system for Time-Delay-Integration, i.e. synchronizing the readout of an imaging array with the a moving image, in Complementary Metal Oxide Semiconductor (CMOS) imaging sensors 10, the system comprising: a two dimensional parallel charge transfer structure comprising at least one column of CMOS Image sensor pinned photodiodes; each photodiode 14 in the column 12 being connected to the next the photodiode 14 by a two phase transfer gate 16, each transfer gate 16 having a barrier 18 and a well 20 configured such that a flow of charge in the column 12 is unidirectional. In such a system each well may be configured to hold the full well capacity of a pixel. The system may further comprise a microlens 24 disposed so as to direct photons between the transfer gates 16 into the photodiodes 14. Such a system may also comprise at least one color filter (not shown). In such an embodiment, a single color filter would be used per array because it is required that each pixel have the same spectral performance since each only provides part of the final image. The system 10 may comprise a plurality of the columns of CMOS image sensor pinned photodiodes in an array or a plurality of arrays.

One embodiment provides a method for manufacturing a Time-Delay-Integrated CMOS imaging sensor, the method comprising: starting with a wafer substrate 30; isolating at least one pixel 32; doping at least a first region of the substrate to for at least one transfer well 34; doping at least a second region of the substrate to form at least one transfer barrier 38; forming a transfer gate 40 from the at least one transfer barrier; doping at least a third region of the substrate to form a photodiode barrier 44; doping at least a fourth region of the substrate to form a photodiode well 46; forming gate sidewalls in the substrate 48; applying a photodiode pinning layer to the substrate 50; forming at least one connection 54, 56 on the substrate, the connection being selected from the group of connections consisting of contacts, metal vias, and interconnects; and formation of at least one chip from the substrate 58. In such a method, the technique involves isolating the at least one pixel and may comprise forming shallow trenches between columns of the pixels 32. Similarly, the step of forming shallow trenches between the columns of the pixels may be performed by etching the shallow trenches between the columns of the pixels and isolating at least one pixel may be achieved by doping the wafer substrate in a pattern so as to isolate the pixel.

Such a method may also include doping at least a fifth region of the substrate as a Field Effect Transistor threshold shift region 36; forming a FET from the FET threshold shift region 42; and doping the fifth region of the substrate to form at least one FET source and at least one FET drain. A sensor may be formed from the chip.

A still further embodiment provides such a method with the additional steps of disposing at least one microlens proximate to the at least one pixel, such that light passing through the microlens is directed toward a photodiode comprising the photodiode barrier and photodiode well. Similarly, a color filter may be disposed—proximate to the pixel such that light incident on the pixel is filtered.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system for time delay integration in Complementary Metal Oxide Semiconductor (CMOS) imaging sensors, the system comprising:
   a two dimensional parallel charge transfer structure comprising at least one column of CMOS photodiodes;
   each said photodiode in the column being connected to the next diode by a two phase transfer gate, each said transfer gate having a barrier and a well configured such that a flow of charge in the column is unidirectional.

2. The system of claim 1 wherein each said well is configured to hold the full well capacity of a pixel.

3. The system of claim 1 further comprising a microlens disposed so as to direct photons between said transfer gates into said photodiodes.

4. The system of claim 1 further comprising at least one color filter.

5. The system of claim 1 wherein said system comprises a plurality of the columns of CMOS photodiodes in an array.

6. The system of claim 5 wherein said system comprises a plurality of said arrays.

7. A method for manufacturing a time delay integrated Complementary Metal Oxide Semiconductor (CMOS) imaging sensor, said method comprising:
   starting with a wafer substrate;
   isolating at least one pixel;
   doping at least a first region of said substrate for at least one transfer well;
   doping at least a second region of said substrate to form at least one transfer barrier;
   forming a transfer gate from said at least one transfer barrier;
   doping at least a third region of said substrate to form a photodiode barrier;
   doping at least a fourth region of said substrate to form a photodiode well;
   forming gate sidewalls in said substrate;
   applying a photodiode pinning layer to said substrate;
   forming at least one connection on said substrate, said connection being selected from the group of connections consisting of contacts, metal vias, and interconnects; and
   producing of at least one chip from said substrate.

8. The method of claim 7 wherein said isolating said at least one pixel comprises forming shallow trenches between columns of said pixels.

9. The method of claim 8 wherein said step of forming shallow trenches between said columns of said pixels is by etching said shallow trenches between said columns of said pixels.

10. The method of claim 7 wherein said isolating at least one pixel comprises doping said wafer substrate in a pattern so as to isolate said pixel.

11. The method of claim 7 further comprising:
   doping at least a fifth region of said substrate as a Field Effect Transistor (FET) threshold shift region;
   forming a FET from said FET threshold shift region; and
   doping said fifth region of said substrate to form at least one FET source and at least one FET drain.

12. The method of claim 7, further comprising forming a sensor from said chip 11 The method of claim 7 further comprising disposing at least one microlens proximate to said at least one pixel, such that light passing through said microlens is directed toward a photodiode comprising said photodiode barrier and photodiode well.

* * * * *